(12) United States Patent  
Amdahl

(10) Patent No.: US 9,002,806 B1
(45) Date of Patent: *Apr. 7, 2015

(54) COMPRESSION OF DATA TRANSMITTED OVER A NETWORK

(75) Inventor: Saxon C. Amdahl, Los Gatos, CA (US)

(73) Assignee: F5 Networks, Inc., Seattle, WA (US)

( * ) Notice: Subject to any disclaimer, the term of this patent is extended or adjusted under 35 U.S.C. 154(b) by 583 days.

This patent is subject to a terminal disclaimer.

(21) Appl. No.: 12/963,531

(22) Filed: Dec. 8, 2010

Related U.S. Application Data

(63) Continuation of application No. 11/339,031, filed on Jan. 25, 2006, now Pat. No. 7,882,084.

(60) Provisional application No. 60/755,175, filed on Dec. 30, 2005.

(51) Int. Cl.
 *G06F 17/30* (2006.01)
 *G06F 7/00* (2006.01)

(52) U.S. Cl.
 CPC .................. *G06F 17/30522* (2013.01)

(58) Field of Classification Search
 USPC .................................................. 707/693, 697
 See application file for complete search history.

(56) References Cited

U.S. PATENT DOCUMENTS

| 4,021,782 A | 5/1977 | Hoerning |
| 4,054,951 A | 10/1977 | Jackson et al. |
| 4,316,222 A | 2/1982 | Subramaniam et al. |
| 4,386,416 A | 5/1983 | Giltner et al. |
| 4,593,324 A | 6/1986 | Ohkubo et al. |
| 4,626,829 A | 12/1986 | Hauck |
| 4,701,745 A | 10/1987 | Waterworth et al. |
| 4,862,167 A | 8/1989 | Copeland, III |
| 4,876,541 A | 10/1989 | Storer |

(Continued)

FOREIGN PATENT DOCUMENTS

| EP | 0 929 173 A2 | 7/1999 |
| EP | 0 947 104 B1 | 11/2002 |

(Continued)

OTHER PUBLICATIONS

Cheng, J.M., et al., "A fast, highly reliable data compression chip and algorithm for storage systems," IBM, vol. 40, No. 6, Nov. 1996, 11 pgs.

(Continued)

*Primary Examiner* — Kuen Lu
(74) *Attorney, Agent, or Firm* — John W. Branch; Lowe Graham Jones PLLC

(57) ABSTRACT

A system, method, and apparatus are directed towards identifying adaptive length segments of redundant data for encoding a data structure. Initial boundaries are identified for an input matching segment within input data and for a candidate store matching segment in a synchronized store. The data prior to and after the boundaries are compared to identify matching data. As matching data is identified, at least one of the boundaries of the matching segments is revised. An encoded representation of the resulting input matching segment is then generated based in part on pointers and offsets into the synchronized store. A data structure is generated based on the encoded representation and unmatched portion, which is sent to a receiver. The receiver uses the data structure to extract matching data from the synchronized store, and together with the unmatched input data in the data structure, reconstruct the input data.

20 Claims, 11 Drawing Sheets

(56) References Cited

U.S. PATENT DOCUMENTS

| | | | |
|---|---|---|---|
| 4,890,282 A | 12/1989 | Lambert et al. |
| 4,891,643 A | 1/1990 | Mitchell et al. |
| 4,897,717 A | 1/1990 | Hamilton et al. |
| 4,906,991 A | 3/1990 | Fiala et al. |
| 4,971,407 A | 11/1990 | Hoffman |
| 4,988,998 A | 1/1991 | O'Brien |
| 5,003,307 A | 3/1991 | Whiting et al. |
| 5,016,009 A | 5/1991 | Whiting et al. |
| 5,049,881 A | 9/1991 | Gibson et al. |
| 5,109,433 A | 4/1992 | Notenboom |
| 5,126,739 A | 6/1992 | Whiting et al. |
| 5,146,221 A | 9/1992 | Whiting et al. |
| 5,150,430 A | 9/1992 | Chu |
| 5,155,484 A | 10/1992 | Chambers, IV |
| 5,167,034 A | 11/1992 | MacLean, Jr. et al. |
| 5,212,742 A | 5/1993 | Normile et al. |
| 5,249,053 A | 9/1993 | Jain |
| 5,276,898 A | 1/1994 | Kiel et al. |
| 5,280,600 A | 1/1994 | Van Maren et al. |
| 5,293,379 A | 3/1994 | Carr |
| 5,293,388 A | 3/1994 | Monroe et al. |
| 5,333,212 A | 7/1994 | Lightenberg |
| 5,341,440 A | 8/1994 | Earl et al. |
| 5,367,629 A | 11/1994 | Chu et al. |
| 5,379,036 A | 1/1995 | Storer |
| 5,406,279 A | 4/1995 | Anderson et al. |
| 5,410,671 A | 4/1995 | Elgamal et al. |
| 5,414,425 A | 5/1995 | Whiting et al. |
| 5,463,390 A | 10/1995 | Whiting et al. |
| 5,479,587 A | 12/1995 | Campbell et al. |
| 5,488,364 A | 1/1996 | Cole |
| 5,488,483 A | 1/1996 | Murayama |
| 5,504,842 A | 4/1996 | Gentile |
| 5,506,944 A | 4/1996 | Gentile |
| 5,539,865 A | 7/1996 | Gentile |
| 5,542,031 A | 7/1996 | Douglass et al. |
| 5,544,290 A | 8/1996 | Gentile |
| 5,546,395 A | 8/1996 | Sharma et al. |
| 5,546,475 A | 8/1996 | Bolle et al. |
| 5,553,160 A | 9/1996 | Dawson |
| 5,559,978 A | 9/1996 | Spilo |
| 5,615,287 A | 3/1997 | Fu et al. |
| 5,638,498 A | 6/1997 | Tyler et al. |
| 5,646,946 A | 7/1997 | VanderMeer et al. |
| 5,768,445 A | 6/1998 | Troeller et al. |
| 5,768,525 A | 6/1998 | Kralowetz et al. |
| 5,774,715 A | 6/1998 | Madany et al. |
| 5,805,932 A | 9/1998 | Kawashima et al. |
| 5,838,963 A | 11/1998 | Griffiths |
| 5,850,565 A | 12/1998 | Wightman et al. |
| 5,874,907 A | 2/1999 | Craft |
| 5,884,269 A | 3/1999 | Cellier et al. |
| 5,892,847 A | 4/1999 | Johnson |
| 5,909,250 A | 6/1999 | Hardiman |
| 5,951,623 A | 9/1999 | Reynar et al. |
| 5,956,724 A | 9/1999 | Griffiths |
| 5,991,515 A | 11/1999 | Fall et al. |
| 6,070,179 A | 5/2000 | Craft |
| 6,078,923 A | 6/2000 | Burrows |
| 6,138,156 A | 10/2000 | Fletcher et al. |
| 6,178,489 B1 | 1/2001 | Singh |
| 6,314,095 B1 | 11/2001 | Loa |
| 6,473,458 B1 | 10/2002 | Shimizu et al. |
| 6,477,201 B1 | 11/2002 | Wine et al. |
| 6,526,574 B1 | 2/2003 | Jones |
| 6,611,213 B1 | 8/2003 | Bentley et al. |
| 6,650,261 B2 | 11/2003 | Nelson et al. |
| 6,728,785 B1 | 4/2004 | Jungck |
| 6,757,780 B2 | 6/2004 | Stark |
| 6,763,031 B1 | 7/2004 | Gibson et al. |
| 6,839,800 B2 | 1/2005 | Stark |
| 6,879,631 B1 | 4/2005 | Schultz et al. |
| 6,882,753 B2 | 4/2005 | Chen et al. |
| 6,901,476 B2 | 5/2005 | Stark et al. |
| 6,904,176 B1 | 6/2005 | Chui et al. |
| 6,907,071 B2 | 6/2005 | Frojdh et al. |
| 6,957,215 B2 | 10/2005 | Stark |
| 7,017,005 B2 | 3/2006 | Stark |
| 7,054,994 B2 | 5/2006 | Kastoriano et al. |
| 7,076,602 B2 | 7/2006 | Stark et al. |
| 7,200,714 B2 | 4/2007 | Ben-Haim et al. |
| 7,499,912 B2 | 3/2009 | Hershkovich et al. |
| 7,613,787 B2 | 11/2009 | Manasse et al. |
| 7,627,616 B2 | 12/2009 | Hershkovich et al. |
| 7,630,996 B1 | 12/2009 | Hershkovich et al. |
| 2003/0048207 A1* | 3/2003 | Nelson et al. ............ 341/51 |
| 2004/0103215 A1 | 5/2004 | Ernst et al. |

FOREIGN PATENT DOCUMENTS

| | | |
|---|---|---|
| EP | 1 276 324 A1 | 1/2003 |
| EP | 1 424 779 A1 | 6/2004 |
| EP | 1 434 437 A2 | 6/2004 |
| GB | 2489735 A | 10/2012 |
| WO | WO 00/07083 A1 | 2/2000 |
| WO | WO 0171701 A2 | 9/2001 |
| WO | WO 03/073719 A1 | 9/2003 |
| WO | WO 2004/036501 A2 | 4/2004 |
| WO | 2012/136828 A1 | 10/2012 |

OTHER PUBLICATIONS

Simpson, W. "The Point-To-Point Protocol (PPP)," RFC 1661, Jul. 1994, 54 pgs.
Schneider, K., et al. "PPP for Data Compression in Data Circuit-Terminating Equipment (DCE)," RFC 1976, Aug. 1996, 10 pgs.
Castineyra. I., et al. "The Nimrod Routing Architecture," RFC 1992, Aug. 1996, 27 pgs.
Degermark, Mikael et al., "Low-Loss TCP/IP Header Compression for Wireless Networks," J.C. Baltzar AG, Science Publishers, 1997, pp. 375-387.
"Direct Access Storage Device Compression and Decompression Data Flow," IBM Technical Disclosure Bulletin, vol. 38, No. 11, Nov. 1995; pp. 291-295.
"Drive Image Professional for DOS, OS/2, and Windows," WSDC Dowload Guide, http://wsdcds01.watson.ibm.com/WSDC.nsf/Guides/Download/Applications-DriveImage.htm, accessed Nov. 22, 1999, 4 pgs.
"Drive Image Professional," WSDC Download Guide, http://wsdcds01.watson.ibm.com/wsdc.nsf/Guides/Download/Applications-DriveImage.htm, accessed May 3, 2001, 5 pgs.
Electronic Engineering Times, Issue 759, Aug. 16, 1993, 37 pgs.
Adaptive Lossless Data Compression—ALDC, IBM, 1994, 2 pgs.
ALDC1-5S—Adaptive Lossless Data Compression, IBM Microelectronics, May 1994, 2 pgs.
ALDC1-20S—Adaptive Lossless Data Compression, IBM Microelectronics, May 1994, 2 pgs.
ALDC1-40S—Adaptive Lossless Data Compression, IBM Microelectronics, May 1994, 2 pgs.
ALDC-MACRO—Adaptive Lossless Data Compression, IBM Microelectronics, May 1994, 2 pgs.
Craft, David J., "Data Compression Choice No Easy Call," Computer Technology Review, Jan. 1994, 2 pgs.
"Data Compression Applications and Innovations Workshop," Proceedings of a Workshop held in conjunction with the IEEE Data Compression Conference, Mar. 31, 1995, 123 pgs.
IBM Microelectronics Comdex Fall 1993 Booth Location, 1 pg.
"IBM Technology Products Introduces New Family of High-Performance Data Compression Products," IBM Coporation, Somers, NY, Aug. 16, 1993, 6 pgs.
Zebrose, Katherine L., "Integrating Hardware Accelerators into Internetworking Switches," Telco Systems, 10 pgs.
Readme, Powerquest Corporation, 6 pgs.
Costlow, Terry "Sony designs faster, denser tape drive," Electronic Engineering Times, May 20, 1996, 2 pgs.
Electronic Engineering Times, Issue 767, Oct. 11, 1993, 34 pgs.
"IBM Announces New Feature for 3480 Subsystem," Tucson Today, vol. 12, No. 337, Jul. 25, 1989, 1 pg.

(56) References Cited

OTHER PUBLICATIONS

Craft, D.J. "A fast hardware data compression algorithm and some algorithmic extensions," IBM Journal of Research and Development, vol. 42, No. 6, Nov. 1998, 14 pgs.
"Magstar and IBM 3590 High Performance Tape Subsystem Technical Guide," IBM, Nov. 1996, 288 pgs.
"AppClera: Smart Compression" eWEEK.com, Ziff Davis Publishing Holdings Inc., pp. 1-11, © 1996-2006. Can be found at http://www.eweek.com /article2/0,1759,755242,00.asp.
"Data compression—Wikipedia, the free encyclopedia", Wikipedia, pp. 1-7, Dec. 6, 2005. Can be found at http://en.wikipedia.org/wiki/Data_compression_algorithm.
"Data compression ratio—Wikipedia, the free encyclopedia" Wikipedia, pp. 1-2, Dec. 6, 2005. Can be found at http://en.wikipedia.org/wiki/data_compression_ratio.
"Gzip—Wikipedia, the free encyclopedia", Wikipedia, pp. 1-4, Dec. 6, 2005. Can be found at http://en.wikipedia.org/wiki/Gzip.
"HTTP Compression Speeds up the Web What is IETF Content-Encoding (or HTTP Compression)?", pp. 1-5. Can be found at http://webreference.com/internet/software/servers/http/compression/2.html.
"HTTP Compression Speeds up the Web", pp. 1-5. Can be found at http://webreference.com/internet/software/servers/http/compression.
"HTTP Compression", pp. 1-5. Last modified Jan. 17, 2006. Can be found at http://www.websiteoptimization.com/speed/tweak/compress/.
Berners-Lee, T., et al., "Hypertext Transfer Protocol—HTTP/1.0", IETF, RFC 1945, pp. 1-23, May 1996.
Deutsch, P., et al. "ZLIB Compressed Data Format Specification version 3.3", IETF, RFC 1950, pp. 1-11, May 1996.
Deutsch, P., "DEFLATE Compressed Data Format Specification version 1.3", IETF, RFC 1951, pp. 1-17, May 1996.
Deutsch, P., "GZIP file format specification version 4.3", IETF, RFC 1952, pp. 1-12, May 1996.
F5 Networks, Inc. "Configuration Guide for Local Traffic Management" Version 9.0, MAN-0122-01, Chapter 6, pp. 1-26, © 1996-2005.
Fielding, R., et al "Hypertext Transfer Protocol—HTTP/1.1", IETF, RFC 2616, pp. 1-18, Jun. 1999.
Friend, R., et al., "AP Payload Compression Using LZS", IETF, RFC 2395, pp. 1-9, Dec. 1998.
Gailly J., et al., "The gzip home page", pp. 1-8, Last updated Jul. 27, 2003. Can be found at http://www.gzip.org.
Gailly, J., et al., "zlib 1.1.4 Manual", pp. 1-14, Mar. 11, 2002. Can be http://www.zlib.net/manual.html.
Gailly, J., "gzip The data compression program", Edition 1.2.4 for Gzip Version 1.2.4, pp. 1-13, Jul. 1993. Can be found at http://www.gnu.org/software/gzip/manual/html_mono/gzip.html.
Gailly, J., "Invoking gzip", pp. 1-2, Jul. 1993. Can be found at http://www.math.utah.edu/docs/info/gzip_4.html#SEC7.
Gailly, J. "Overview", pp. 1-2, Jul. 1993. Can be found at http://www.math.utah.edu/docs/info/gzip_2.html#SEC5.
Heath, J., et al., "IP Payload Compression Using ITU-T V.44 Packet Method", IETF, RFC 3051, pp. 1-8, Jan. 2001.
Jeannot, E., et al., "Adaptive Online Data Compression", 11th IEEE International Symposium on High Performance Distributed Computing, pp. 1-57, 2002.
Krintz, C., et al., "Adaptive on-the-Fly Compression (Abstract)", EEE Computer Society, vol. 17, No. 1, pp. 1-2, Jan. 2006. Can be found at http://csdl2.computer.org/persagen/DLAbsToc.jsp?resourcePath=/dl/trans/td/&toc=comp/trans/td/2006/01/l1toc.xml&DOI-10.1109/TPDS.2006.3.
Leurs, L., "Flate/deflate compression", pp. 1-2, © 2000. Can be found at http://prepressure.com/techno/compressionflat.htm.
Pereira, R., "IP Payload Compression Using DEFLATE", IETF, RFC 2394, pp. 1-6, Dec. 1998.
Pierzchala, S., "Compressing Web Content with mod_gzip and mod_deflate", Linux Journal, pp. 1-10, Apr. 26, 2004. Can be found at http://linuxjournal.com/article/6802.
Roelofs, G., zlib A Massively Spiffy Yet Delicately Unobtrusive Compression Library (Also Free, Not to Mention Unencumbered by Patents), pp. 1-5, Last updated on Aug. 7, 2005. Can be found at http://www.zlib.net.
Seshan, S., et al., "SPAND: Shared Passive Network Performance Discovery", USENIX Symposium on Internet Technologies and Systems, pp. 1-13, Dec. 1997.
Roelofs, G., et al., "zlib Frequently Asked Questions", pp. 1-7, last modified Jul. 18, 2005 by Mark Adler,© 1996-2005. Can be found at http://www.zlib.net/zlib_faq.html#faq 38.
Official Communication for U.S. Appl. No. 11/339,031 mailed May 13, 2008.
Official Communication for U.S. Appl. No. 11/339,031 mailed Dec. 29, 2008.
Official Communication for U.S. Appl. No. 11/339,031 mailed Jun. 3, 2009.
Official Communication for U.S. Appl. No. 11/339,031 mailed Jan. 22, 2010.
Official Communication for U.S. Appl. No. 11/339,031 mailed Jul. 9, 2010.
Official Communication for U.S. Appl. No. 11/339,031 mailed Oct. 1, 2010.

* cited by examiner

COMPRESSION OF DATA TRANSMITTED OVER A NETWORK

CROSS-REFERENCE TO RELATED APPLICATIONS

This utility patent application is a continuation U.S. patent application Ser. No. 11/339,031 filed on Jan. 25, 2006, and entitled "Compression of Data Transmitted Over a Network" the benefit of which is claimed under 35 U.S.C. §120, and which is incorporated herein by reference, and which in turn claims priority from provisional patent application Ser. No. 60/755,175 entitled "Compression of Data Transmitted Over a Network," filed on Dec. 30, 2005, the benefit of the earlier filing date of which is hereby claimed under 35 U.S.C. §119 (e), and which is further incorporated herein by reference.

BACKGROUND OF THE INVENTION

This invention relates generally to network communications, and more particularly but not exclusively, to selectively revising a boundary of a segment of data based on matching data in input data to data in a previously transferred data file (synchronized store).

According to some studies, the volume of information over a network, such as the Internet, is expected to more than triple over the next three years. Data and content is likely to remain the largest percentage of Internet traffic, with the majority of this information being dynamic. Often, the issues of concern with Internet traffic range from business to consumer response and order times, to the time required to deliver business information to a traveler using a wireless device, to the download time for media such as documents, music, videos, and so forth. Thus, not surprisingly, a major complaint among Internet users is a lack of speed. Additionally, users' complaints often center on how long it takes to get a document or other response to a request for a resource, to their computing device. Thus, it is with respect to these considerations and others that the present invention has been made.

BRIEF DESCRIPTION OF THE DRAWINGS

Non-limiting and non-exhaustive embodiments of the invention are described with reference to the following drawings. In the drawings, like reference numerals refer to like parts throughout the various figures unless otherwise specified.

For a better understanding of the invention, reference will be made to the following Detailed Description of the Invention, which is to be read in association with the accompanying drawings, wherein.

DETAILED DESCRIPTION OF THE INVENTION

Figure 1:
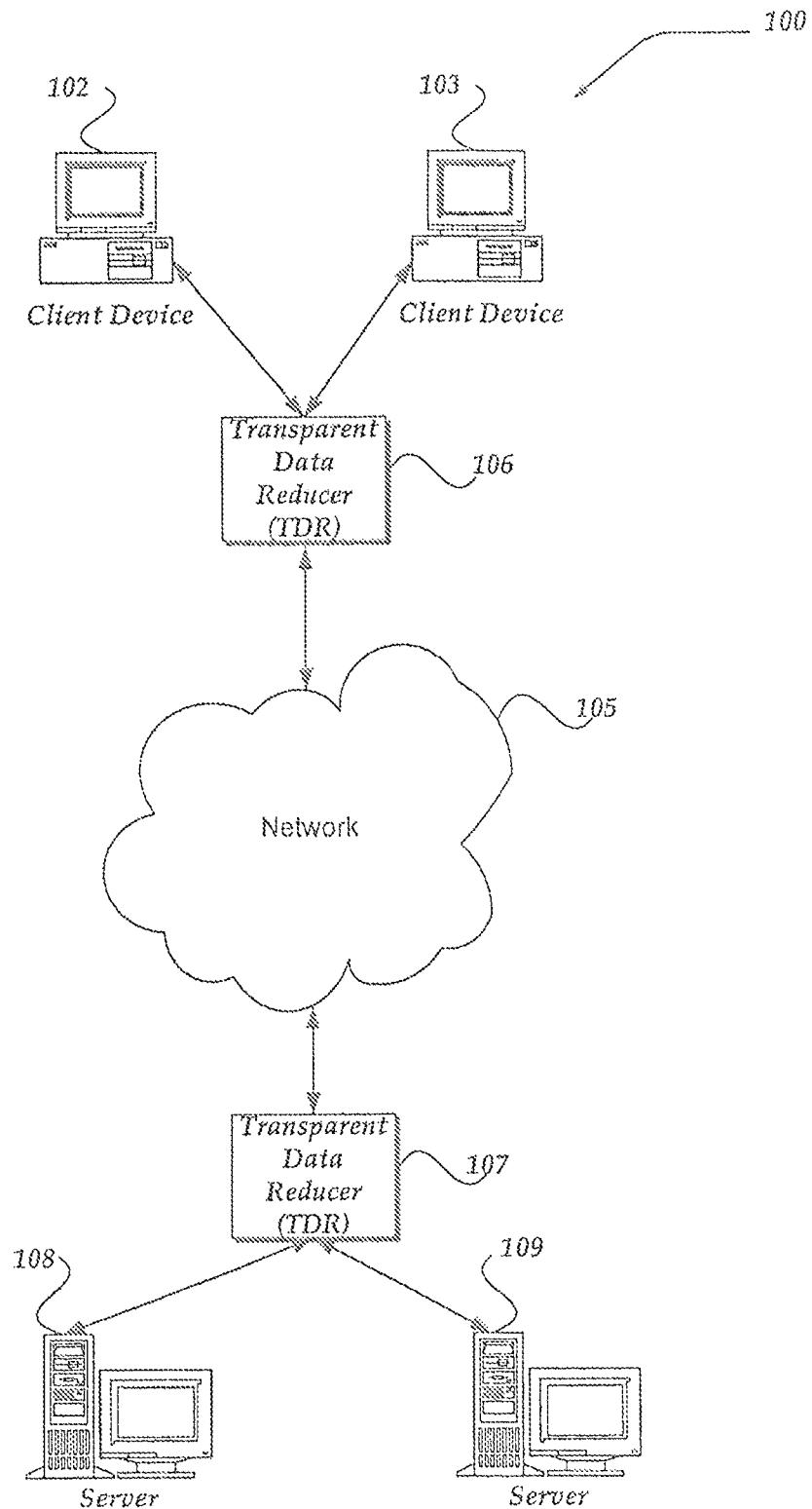
FIG. 1 shows a functional block diagram illustrating one embodiment of an environment for practicing the invention.

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, the invention is directed towards a system, apparatus, and method for determining selective length segments of redundant data for use in encoding into a data structure. Potential starting positions within input data are examined to select a chunk of data as a candidate input matching data segment for data encoding. The selected chunk of data may be determined based on having a best fitness function within a sliding window. In one embodiment, the best fitness function value is determined as the highest sum of bytes. The selected chunk of data is then employed to identify initial first and second boundaries for the input matching segment within the input data.

In one embodiment, a checksum is determined from the selected chunk of data. The checksum is used as an index into a dictionary to locate a file identifier and offset into a synchronized store as an initial starting position. The chunk of data and initial starting position are used to identify initial first and second boundaries for a candidate store matching segment of data within a synchronized store. In one embodiment, the synchronized store includes a plurality of files that were transmitted between a sender and receiver device. In one embodiment, a synchronized store is accessible by the sender, and another synchronized store is accessible by the receiver.

The data prior to and after the boundaries of the input matching segment and candidate store matching segment are compared to identify matching data. As matching data is identified, at least one of the boundaries of the matching segments is revised. Because the resulting boundaries are selectively revised based on identifying matching data, the position and size of the resulting matching segments may be different from the initial position and size of the matching segments. Thus, for example, the resulting input matching segment may include data from less than the chunk of data. In another example, the resulting input matching segment may include data other than from the chunk of data. In still another example, the resulting input matching segment may include data before the chunk of data, the chunk of data, and/or data after the chunk of data.

In any event, an unmatched portion of data within the input data that is distinct from the input matching data segment is then determined. In one embodiment, the unmatched portion of data may be an empty set. In addition, a data structure may be generated from any unmatched data from the input data together with an encoded set of pointers and offsets to the matching segment of data within the synchronized store. In one embodiment, the pointer is a file identifier, with the offset representing an offset within the file identified within the synchronized store. By representing the matching data as pointers and offsets, the amount of data sent over the network may be reduced.

In one embodiment, at least a portion of the data structure may be compressed using any of a variety of file compression techniques. In another embodiment, subsequent compression ratios of the data structure may be improved by further generating the data structure with values for the pointers and offsets as differences between previous un-encoded pointer and offset values and currently determined pointer and offset values.

The data structure may then be sent to the receiver over the network. The receiver uses the data structure to extract the matching segment from the synchronized store, and together with the unmatched data in the data structure, reconstruct the original input data. Moreover, synchronization of the synchronized store may be performed using any of a variety of file replication and/or or synchronization mechanisms.

Illustrative Operating Environment

FIG. 1 illustrates an environment in which the invention may operate. However, not all of these components may be required to practice the invention, and variations in the arrangement and type of the components may be made without departing from the spirit or scope of the invention.

As shown in the figure, system 100 includes client devices 102-103, network 105, Transparent Data Reducers (TDRs) 106-107, and servers 108-109. TDR 106 is in communication with client devices 102-103, and through network 105, with TDR 107. TDR 107 is further in communication with servers 108-109.

Generally, client devices 102-103 may include virtually any computing device capable of connecting to another computing device and receiving information. Such devices may also include portable devices such as, cellular telephones, smart phones, display pagers, radio frequency (RF) devices, infrared (IR) devices, Personal Digital Assistants (PDAs), handheld computers, wearable computers, tablet computers, integrated devices combining one or more of the preceding devices, and the like. Client devices 102-103 may also include other computing devices, such as personal computers, multiprocessor systems, microprocessor-based or programmable consumer electronics, network devices, and the like. As such, client devices 102-103 may range widely in terms of capabilities and features. For example, a client device configured as a cell phone may have a numeric keypad and a few lines of monochrome LCD display on which only text may be displayed.

In another example, a web-enabled client device may have a touch sensitive screen, a stylus, and several lines of color LCD display in which both text and graphics may be displayed. Moreover, the web-enabled client device may include a browser application enabled to receive and to send wireless application protocol messages (WAP), and/or wired application messages, and the like. In one embodiment, the browser application is enabled to employ HyperText Markup Language (HTML), Dynamic HTML, Handheld Device Markup Language (HDML), Wireless Markup Language (WML), WMLScript, JavaScript, EXtensible HTML (xHTML), Compact HTML (CHTML), and the like, to display and send a message.

Client devices 102-103 also may include at least one client application that is configured to receive content from another computing device. The client application may include a capability to provide and receive textual content, graphical content, audio content, alerts, messages, and the like. Moreover, client devices 102-103 may be further configured to communicate a message, such as through a Short Message Service (SMS), Multimedia Message Service (MMS), instant messaging (IM), internet relay chat (IRC), mIRC, Jabber, and the like, between another computing device, and the like.

In one embodiment, client devices 102-103 may be configured such that an end-user may operate the computing device to make requests for data and/or services from other computers on the network. In one embodiment, client devices 102-103 may employ a network interface unit (sometimes called a transceiver), such as described below, to communicate information with another computing device. In one embodiment, the requested data resides in computing devices such as servers 108-109. In this specification, the term "client" refers to a computer's general role as a requester of data or services, and the term "server" refers to a computer's role as a provider of data or services. In general, it is possible that a computer can act as a client, requesting data or services in one transaction and act as a server, providing data or services in another transaction, thus changing its role from client to server or vice versa. In one embodiment, client devices 102-103 are a computing device that is not operated by an end-user.

Network 105 is configured to couple one computing device with another computing device. Network 105 may be enabled to employ any form of computer readable media for communicating information from one electronic device to another. Also, network 105 can include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another. Also, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communications links known to those skilled in the art. Furthermore, remote computers and other related electronic devices could be remotely connected to either LANs or WANs via a modem and temporary telephone link.

Network 105 may further include any of a variety of wireless sub-networks that may further overlay stand-alone ad-hoc networks, and the like, to provide an infrastructure-oriented connection. Such sub-networks may include mesh networks, Wireless LAN (WLAN) networks, cellular networks, and the like. Network 105 may also include an autonomous system of terminals, gateways, routers, and the like connected by wireless radio links, and the like. These connectors may be configured to move freely and randomly and organize themselves arbitrarily, such that the topology of network 105 may change rapidly.

Network 105 may further employ a plurality of access technologies including 2nd (2G), 2.5, 3rd (3G), 4th (4G) generation radio access for cellular systems, WLAN, Wireless Router (WR) mesh, and the like. Access technologies such as 2G, 3G, and future access networks may enable wide area coverage for mobile devices with various degrees of mobility. For example, network 105 may enable a radio connection through a radio network access such as Global System for Mobile communication (GSM), General Packet Radio Services (GPRS), Enhanced Data GSM Environment (EDGE), Wideband Code Division Multiple Access (WCDMA), CDMA2000, and the like. In essence, network 105 may include virtually any wired and/or wireless communication mechanisms by which information may travel between one computing device and another computing device, network, and the like.

Additionally, communication media typically embodies computer-readable instructions, data structures, program modules, or other data in a modulated data signal such as a carrier wave, data signal, or other transport mechanism and includes any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

One embodiment of TDRs 106-107 is described in more detail below in conjunction with FIG. 2. Briefly, however, TDRs 106-107 may include virtually any device that manages network traffic. Such devices include, for example, routers, proxies, firewalls, load balancers, cache devices, devices that perform network address translation, any combination of the preceding devices, and the like. TDRs 106-107 may, for example, control the flow of data packets delivered to and forwarded from an array of computing devices, such as servers 108-109, client devices 102-103, or the like. For example, TDR 107 may direct a request for a resource to a particular server based on network traffic, network topology, capacity of a server, content requested, and a host of other traffic distribution mechanisms. TDRs 106-107 may receive data packets from and transmit data packets to the Internet, an intranet, or a local area network accessible through another network. TDRs 106-107 may recognize packets that are part of the same communication, flow, and/or stream and may perform special processing on such packets, such as directing them to the same server so that state information is maintained. TDRs 106-107 also may support a wide variety of network applications such as Web browsing, email, telephony, streaming multimedia and other traffic that is sent in packets.

TDR 106 may receive requests from client devices 102-103, and forward the request over network 105 to TDR 107. TDR 107 may select a server from servers 108-109 to forward the request. TDR 107 may employ any of a variety of criteria and mechanisms to select the server, including those mentioned above, load balancing mechanisms, and the like. TDR 107 is further configured to receive a response to the request. TDR 107 may determine whether at least a portion of the response includes data redundant to a prior response. If so, TDR 107 may encode the redundant data into a data structure for use in sending towards the requesting client device. In one embodiment, TDR 107 may employ a synchronized store (not shown) for use in determining a presence of redundant data. Upon receipt of the encoded data structure, TDR 106 may employ another synchronized store, to recreate the response from the encoded data structure for routing to the requesting client device.

Similarly, in one embodiment, TDR 106 may receive data from client devices 102-103 and determine whether at least a portion of the data is redundant to prior data sent by one of client devices 102-103. If so, TDR 106 may similarly encode the redundant data into a data structure for use in sending towards TDR 107. TDR 107 may then employ its synchronized store to recreate the data from the sending client device. TDR 107 may then send the recreated data to one or more of servers 108-109. TDRs 106-107 may also employ processes substantially similar to those described below in conjunction with FIGS. 3-7 to perform at least some of its actions.

TDRs 106-107 may be implemented using one or more personal computers, servers, multiprocessor systems, microprocessor-based or programmable consumer electronics, network PCs, radio frequency (RF) devices, infrared (IR) devices, integrated devices combining one or more of the preceding devices, and the like. Such devices may be implemented solely in hardware or in hardware and software. For example, such devices may include some application specific integrated circuits (ASICs) coupled to one or more microprocessors. The ASICs may be used to provide a high-speed switch fabric while the microprocessors may perform higher layer processing of packets. An embodiment of a network device that could be used as TDRs 106-107 is network device 200 of FIG. 2, configured with appropriate software. The BIG-IP® family of traffic managers, by F5 Networks of Seattle, Wash., are examples of devices that may be employed as TDRs.

Servers 108-109 may include any computing device capable of communicating packets with client computer 102 to provide a response to a request for data and/or services. Each packet may convey a piece of information. A packet may be sent for handshaking, e.g., to establish a connection or to acknowledge receipt of data. The packet may include information such as a request, a response, or the like. Generally, packets received by servers 108-109 will be formatted according to TCP/IP, but they could also be formatted using another transport protocol, such as User Datagram Protocol (UDP), Internet Control Message Protocol (ICMP), NETbeui, IPX/SPX, token ring, and the like. Moreover, the packets may be communicated between servers 108-109, TDRs 106-107, and client devices 102-103 employing HTTP, or the like.

In one embodiment, servers 108-109 are configured to operate as a website server. However, servers 108-109 are not limited to web servers, and may also operate a messaging server, a File Transfer Protocol (FTP) server, a database server, content server, and the like. Additionally, each of servers 108-109 may be configured to perform a different operation. Thus, for example, server 108 may be configured as a messaging server, while server 109 is configured as a database server. Moreover, while servers 108-109 may operate as other than a website, they may still be enabled to receive an HTTP communication.

Devices that may operate as servers 108-109 include personal computers, desktop computers, multiprocessor systems, microprocessor-based or programmable consumer electronics, network PCs, servers, and the like.

Illustrative TDR Environment

Figure 2:
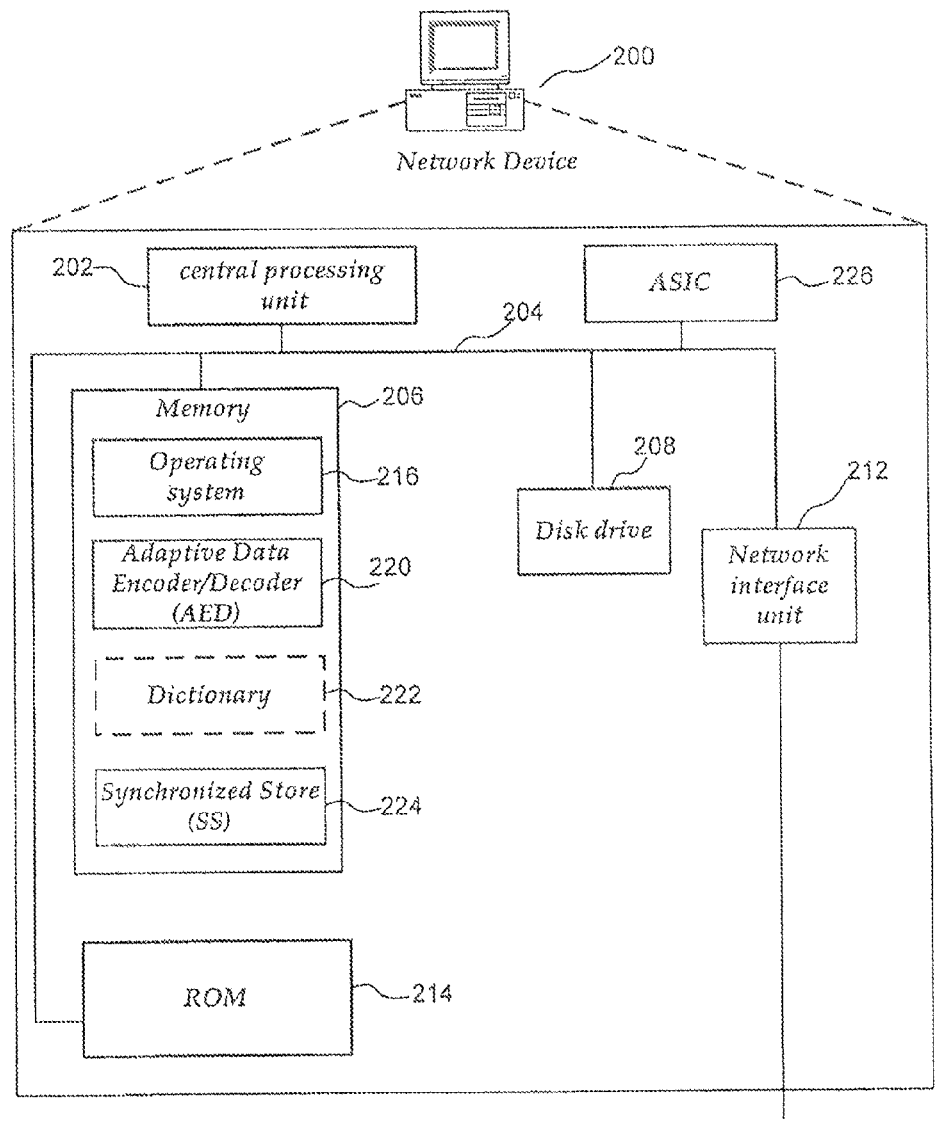
FIG. 2 shows one embodiment of a server device that may be included in a system implementing the invention.

FIG. 2 shows an exemplary network device 200 that may operate as TDR 106-107 of FIG. 1. It will be appreciated that not all components of network device 200 are illustrated, and that network device 200 may include more or less components than those shown in FIG. 2.

As illustrated in FIG. 2, network device 200 includes a central processing unit (CPU) 202, mass memory, and a network interface unit 212 connected via a bus 204. Network interface unit 212 includes the necessary circuitry for connecting network device 200 to various networks, including network 105 of FIG. 1, and is constructed for use with various communication protocols including the TCP/IP and UDP/IP protocol. Network interface unit 212 may include or interface with circuitry and components for transmitting messages and data over a wired and/or wireless communications medium. Network interface unit 212 is sometimes referred to as a transceiver, Network Interface Card (NIC), or the like.

In one embodiment, network device 200 includes one or more Application Specific Integrated Circuit (ASIC) chip 226 connected to bus 204. As shown in FIG. 2, network interface unit 212 may connect to 204 bus through at least one ASIC chip. ASIC chip 226 can include logic that enables at least some of the actions of network device 200. For example, in one embodiment, ASIC chip 226 can be employed to perform packet processing functions on incoming and/or outgoing packets. In one embodiment, ASIC chip 226 performs logic for network monitor 220 and/or redirect coordinator 224. In one embodiment, network device 200 includes one or more field-programmable gate arrays (FPGA) (not shown), instead of, or in addition to, ASIC chip 226. A number of actions for the network device can be performed by ASIC chip 226, an FPGA, CPU 202 with instructions stored in memory, or any combination of actions performed by the ASIC chip, FPGA, and CPU.

Computer storage media may include volatile and nonvolatile, removable and non-removable media implemented in any method or technology for storage of information, such as computer readable instructions, data structures, program modules or other data. Examples of computer storage media include RAM 206, ROM 214, EEPROM, flash memory and/or any other memory architecture, CD-ROM, digital versatile disks (DVD) and/or any other optical storage, magnetic cassettes, magnetic tape, magnetic disk storage and/or any other magnetic storage devices, and/or any other medium that can store information that can be accessed by a computing device.

Network device 200 may also include an input/output interface (not shown) for communicating with external devices or users.

Network device 200 can be implemented as one or more "blades" where the term "blade" refers to one of multiple electronic circuit boards or cards that are installed in a hardware chassis with a backplane. An exemplary blade may include one or more processors, volatile and non-volatile memory, interfaces suitable for communicating information to and from the blade, and other components for enabling the operation of one or more applications. A blade may also include a specialized interface for the backplane and other interfaces, such as a USB port, FIREWIRE port, serial port, RF interface, IR interface, Ethernet interface, IDE controller, and the like. An application running on a blade may employ any of these interfaces to communicate information to other applications running on other blades and/or devices coupled to the blade server. Network device 200 can also be implemented as a combination of blades and additional components in the chassis.

The mass memory generally includes random access memory ("RAM") 206, read-only memory ("ROM") 214, and one or more permanent mass storage devices, such as hard disk drive 208. The mass memory stores operating system 216 for controlling the operation of network device 200. The operating system 216 may comprise an operating system such as UNIX, LINUX™, or Windows™. In one embodiment, the mass memory may store program code and data for implementing synchronized store 224, dictionary 222, and adaptive data encoder/decoder (AED) 220. In one embodiment, where network device 200 is configured to merely receive encoded data structures, dictionary 222 may be absent.

One embodiment of synchronized store 224 is described in more detail below in conjunction with FIG. 9. Briefly, however, synchronized store 224 may include a database, text, folder, file, spreadsheet, documents, or the like, that is configured to maintain and store one or more portions of one or more data files. In one embodiment, the portions of data are stored in synchronized store 224 in an array structure. The portions of data may be accessed using a file identifier and/or an offset.

Synchronized store 224 may be synchronized with another synchronized store residing on another computing device using any of a variety of mechanisms, including data base replication techniques, or the like. In one embodiment, synchronization of the data across one or more other synchronized stores is performed using an out-of-band data transfer mechanism. In one embodiment, the data transfer may be performed on a regular schedule. In another embodiment, updates to other synchronized stores may be performed based on a change to synchronized store 224, or another synchronized store. In another embodiment, the synchronized store may be synchronized, at least in part, based on the unmatched data received within a data structure.

One embodiment of dictionary 222 is described in more detail below in conjunction with FIG. 9. Briefly, however, dictionary 222 may include a database, text, folder, file, array, hash table, or the like, that is configured to locate a portion of data within synchronized store 224. In one embodiment, dictionary may include an array of entries representing file identifiers and offsets into synchronized store 224. The array may be structured so that the file identifiers and offsets are indexed based on a key. In one embodiment, the key is a checksum. Thus, in one embodiment, the checksum value may also reside within dictionary 222.

Although dictionary 222 and synchronized store 224 are illustrated within memory 206, the invention is not so limited. For example, dictionary 222 and/or synchronized store 224 may also be stored and accessed from disk drive 208, or other storage device (not shown). In one embodiment, dictionary 222 and/or synchronized store 224 may also be stored and accessed from another computing device, without departing from the scope of the invention.

AED 220 is configured to identify data in input data that is redundant to (or matches) previously transmitted data for encoding into a data structure. AED 220 may initially perform an alignment of data between the input data and data within synchronized store 224 so that a portion of the input data may be identified as having been previously sent over a network. AED 220 may accomplish the alignment of the data by examining the input data to identify an initial starting position and chunk of data within the input data upon which to begin comparisons. In one embodiment, the alignment may be performed using a fitness function that is applied to potential starting positions within the input data. The position in the input data with a highest fitness function value may be used as an initial starting position from which to perform match comparisons. In one embodiment, the fitness function is a sum of data across a fixed size chunk of data.

AED 220 may then determine a checksum for the selected candidate chunk of data. The checksum may be employed as an index into dictionary 222. An entry is retrieved from dictionary 222 that may include a file identifier, offset, and a checksum. In one embodiment, the retrieved checksum may be compared to the determined checksum to confirm that the appropriate entry is retrieved. AED 220 may then employ the file identifier and offset to locate a corresponding starting position within synchronized store 224.

The initial starting positions and size of the chunk of data are used to locate initial first and second boundaries for an input matching segment of data in the input data, and corresponding initial first and second boundaries for a candidate store matching segment within synchronized store 224. Using the initial boundaries, data prior to and after the boundaries are compared to identify matching data. As matching data is identified, at least one of the boundaries of the matching segments within the input data and synchronized store 224 may be revised. The resulting input matching segment and resulting store matching segment may include data that matches or is redundant between input data and data within synchronized store 224.

AED 220 may then determine an unmatched portion of the input data that is distinct from the resulting matching segment of data. AED 220 may then generate an encoded representation of matching segment of data. In one embodiment, the encoded representation includes pointers, offsets, and a value indicating a length of the resulting store matching segment. The pointers and offsets indicate where within the synchronized store to locate the store matching segment of data. AED 220 may then generate a data structure based, in part, on the unmatched data and the encoded representation of one of the matching segments. AED 220 may employ a process such as that described in more detail below in conjunction with FIGS. 3, and 5-7.

AED 220 is further configured to enable decoding of a received data structure using the pointers, offsets, and amount of matched data to extract the matching segment of data from a corresponding synchronized store substantially similar to synchronized store 224. AED 220 may employ a process such as described in more detail below in conjunction with FIG. 4 to recreate the input data at a receiver side.

Generalized Operation

Figure 7:
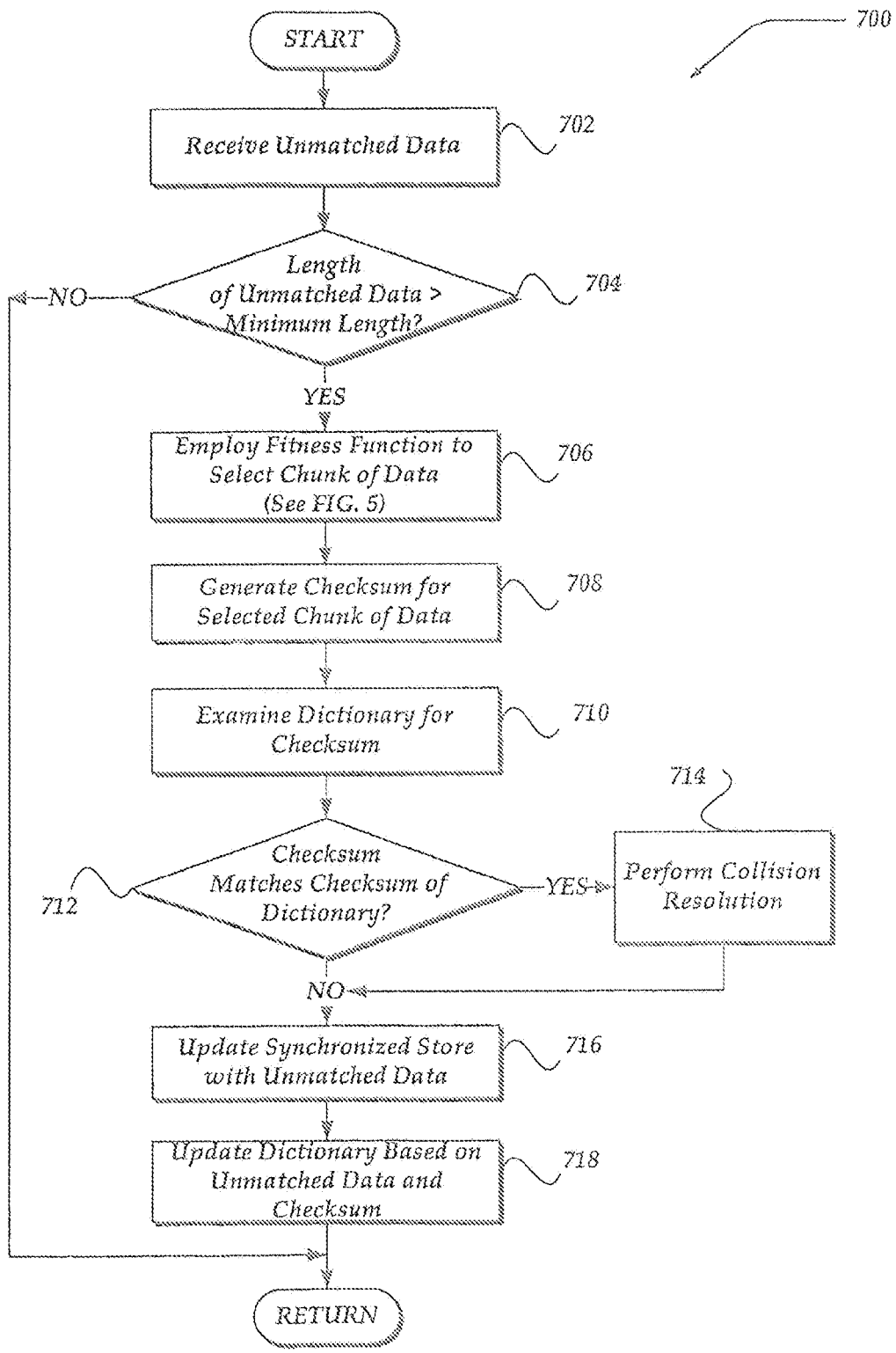
FIG. 7 illustrates a logical flow diagram generally showing one embodiment of a process for updating a synchronized store with unmatched data from input data.
Figure 8:
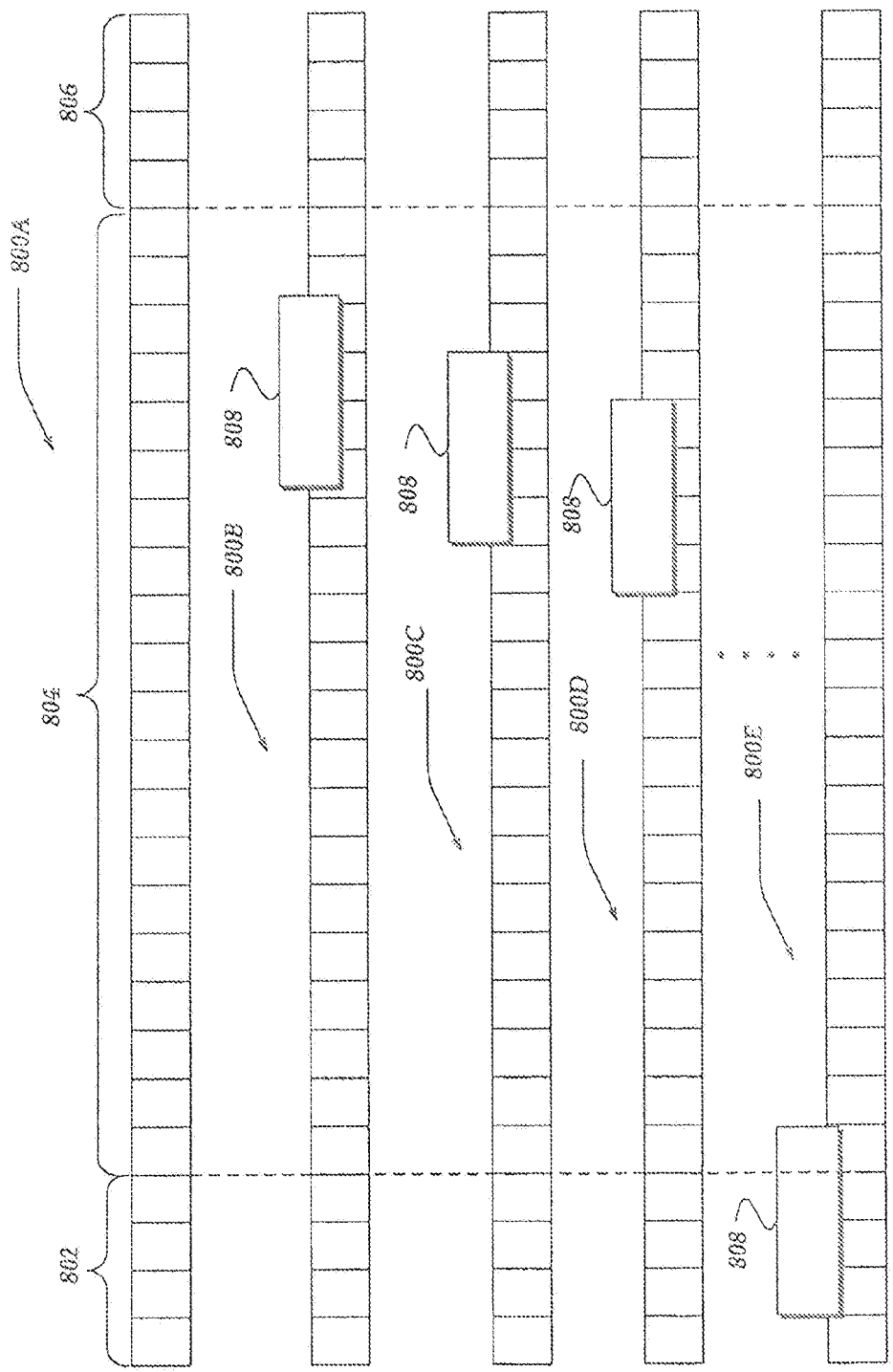
FIG. 8 illustrates functional diagrams of one embodiment of employing an input data buffer upon which a fitness function may be performed to select the starting position.

The operation of certain aspects of the invention will now be described with respect to FIGS. 3-7. Moreover, FIGS. 8-10 provide examples useful in illustrating various aspects of the invention.

Figure 3:
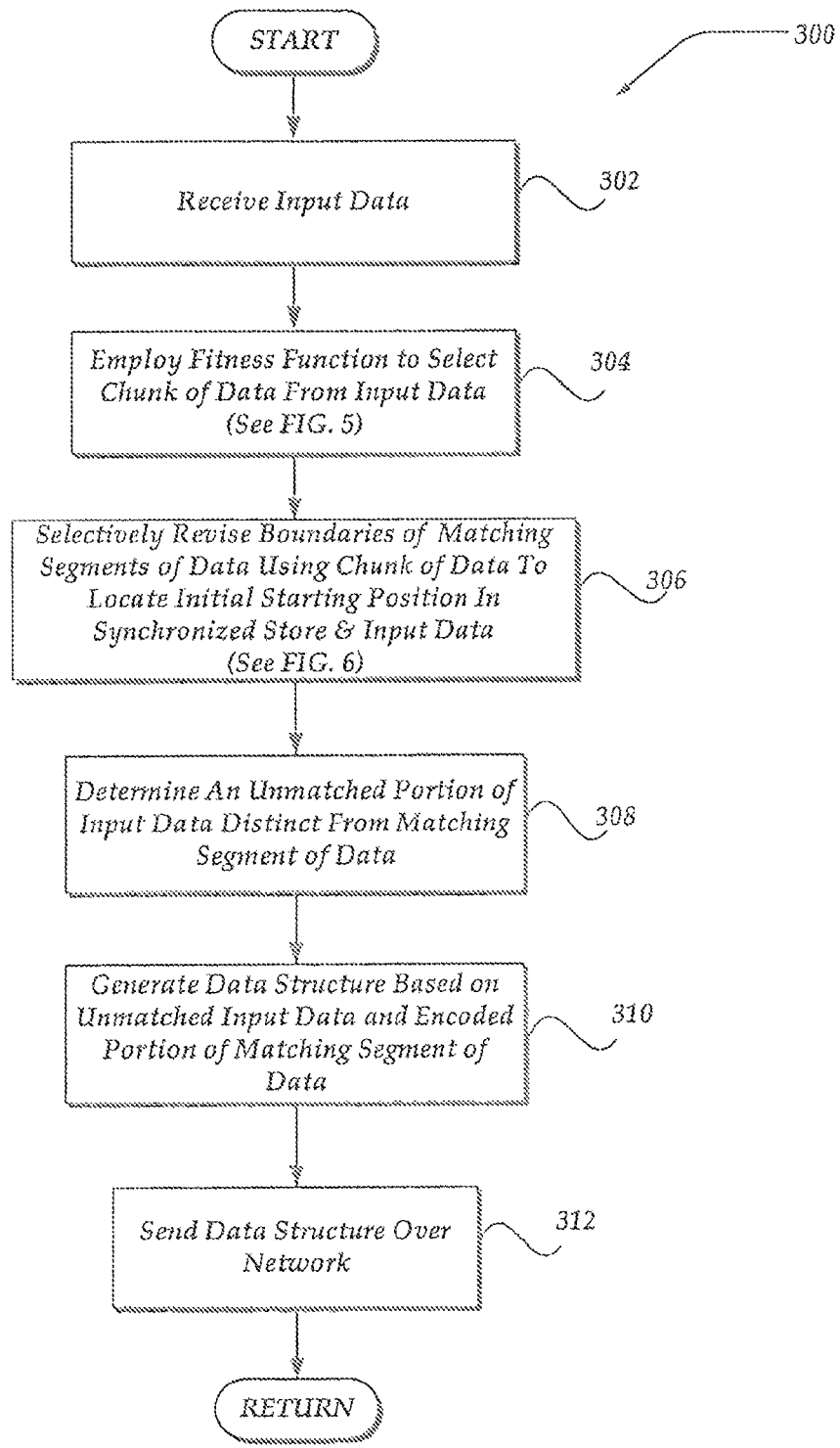
FIG. 3 illustrates a logical flow diagram generally showing one embodiment of an overview process for encoding data transfers by selectively revising a boundary of segments of redundant data.

FIG. 3 illustrates a logical flow diagram generally showing one embodiment of an overview process for encoding data transfers of segments of redundant data. In one embodiment, process 300 of FIG. 3 may be implemented within TDR 107 of FIG. 1.

Process 300 of FIG. 3 begins, after a start block, at block 302 when input data is received ready for selective encoding. In one embodiment, the input data may be a portion of a stream of data, a document, graphic, text, a file, or the like.

Processing then proceeds to block 304, which is described in more detail below in conjunction with FIG. 5. Briefly, however, at block 304, the input data is examined to select a chunk of data and a candidate starting position with which to look for redundant data in a synchronized store. Selection of the chunk of data and candidate starting position may be accomplished using a fitness function.

The selected chunk of data represents a number of contiguous bytes of data. The number of bytes (size) of data may be as small as a single byte to as large as about that of the size of the input data. In one embodiment, the size of the chunk of data may be determined based on a static value. In another embodiment, the size of the chunk of data may be based on another fitness function. Typically, a size of the chunk of data is between about 64 bytes to about 128 bytes. However, the invention is not so limited, and other sizes may be selected, without departing from the scope or spirit of the invention.

The fitness function may include virtually any algorithm or other mechanism that may be used to evaluate multiple data values, potential actions, end states, or the like, and rank or enable a selection of one data value over another data value. Typically, a result of the fitness function is deterministic based at least upon the data values under evaluation.

Once the chunk of data and candidate starting position are determined, processing flows to block 306. Block 306 is described in more detail below in conjunction with FIG. 6. Briefly, however, at block 306, the candidate starting position and chunk of data is employed to locate initial first and second boundaries for a candidate store matching segment within the synchronized store. Similarly, the chunk of data is used to identify initial first and second boundaries for a corresponding input matching segment within the input data. The initial first boundary may then be used to enable comparisons between the input data and data within the synchronized store. As matching data is identified, the boundaries of the candidate store matching segment and input matching segments may be selectively revised. By selectively revising the boundaries, matching data may be inserted into the matching segments selectively expanding the matching segments' lengths.

Process 300 next flows to block 308 where an unmatched portion of the input data is determined that is distinct from the matching segments identified at block 306. In one embodiment, determination of the unmatched portion of the input data may be based on a portion of data remaining within the input data after the input matching segment is determined. In another embodiment, the unmatched portion of the input data is identified after a subsequent matching segment is identified. In this instance, the unmatched data may be the data within the input data between two matching segments of data. In one embodiment, the unmatched data may be determined to be empty. That is, all of the data within the input data is determined to be embodied within one or more matching segments of data, such that no unmatched data remains.

At block 310, an encoded representation of the matching segment is produced based at least partly on the synchronized store. In one embodiment, the encoded representation includes a file identifier and offset into the synchronized store, along with a value indicating how much data (a matching segment's length) within the synchronized store corresponds to the input matching segment. In another embodiment, a network offset is included that represents a length of the unmatched portion of data in the input data.

In one embodiment, the encoded representation may be represented by delta values from an encoded representation of a previously sent matching segment. Thus, for example, where a previously sent file identifier is "123" and the current file identifier is "124," the file identifier may be a delta value of "1." Similarly, the offset, and the like, may also be represented as a delta values from an offset, and the like, in the previously sent encoded representation. Thus, repeated matches to a same portion of data in the synchronized store might be encoded as "0," with repeated matching segment lengths being encoded as "0," and so forth.

Furthermore, a data structure may then be generated that includes the encoded representation and the unmatched data. One embodiment of the data structure is illustrated in FIG. 10. As shown in FIG. 10, the data structure includes encoded representation 1002 and unmatched data 1004 from the input data. Encoded representation includes file identifier 1006, file offset 1008, network offset 1010, and matching segment length 1012.

In one embodiment, the unmatched data may also be compressed using any of a variety of compression techniques, including, but not limited to gzip as described in Request for Comments (RFC) 1952 (available at http://www.ietforg/rfc/rfc1952.txt?number=1952), deflate as described in RFC 1951 (available at http://www.ietf.org/rfc/rfc1951.txt?number=1951), zlib as described in RFC 1950 (available at http://www.ietf.org/rfc/rfc1950.txt?number=1950), each of which is incorporated by reference, as well as other mechanisms, such as glib-deflate, or the like.

Process 300 continues next to block 312, where the data structure may be sent over the network. In one embodiment, the data structure may be encrypted prior to being sent over the network, using virtually any encryption mechanism. Moreover, the data structure may be sent over the network using, for example, TLS, SSL, or another tunneling protocol that enables encryption of a network packet's payload. Upon completion of block 312, process 300 may return to a calling process to perform other actions.

Figure 4:
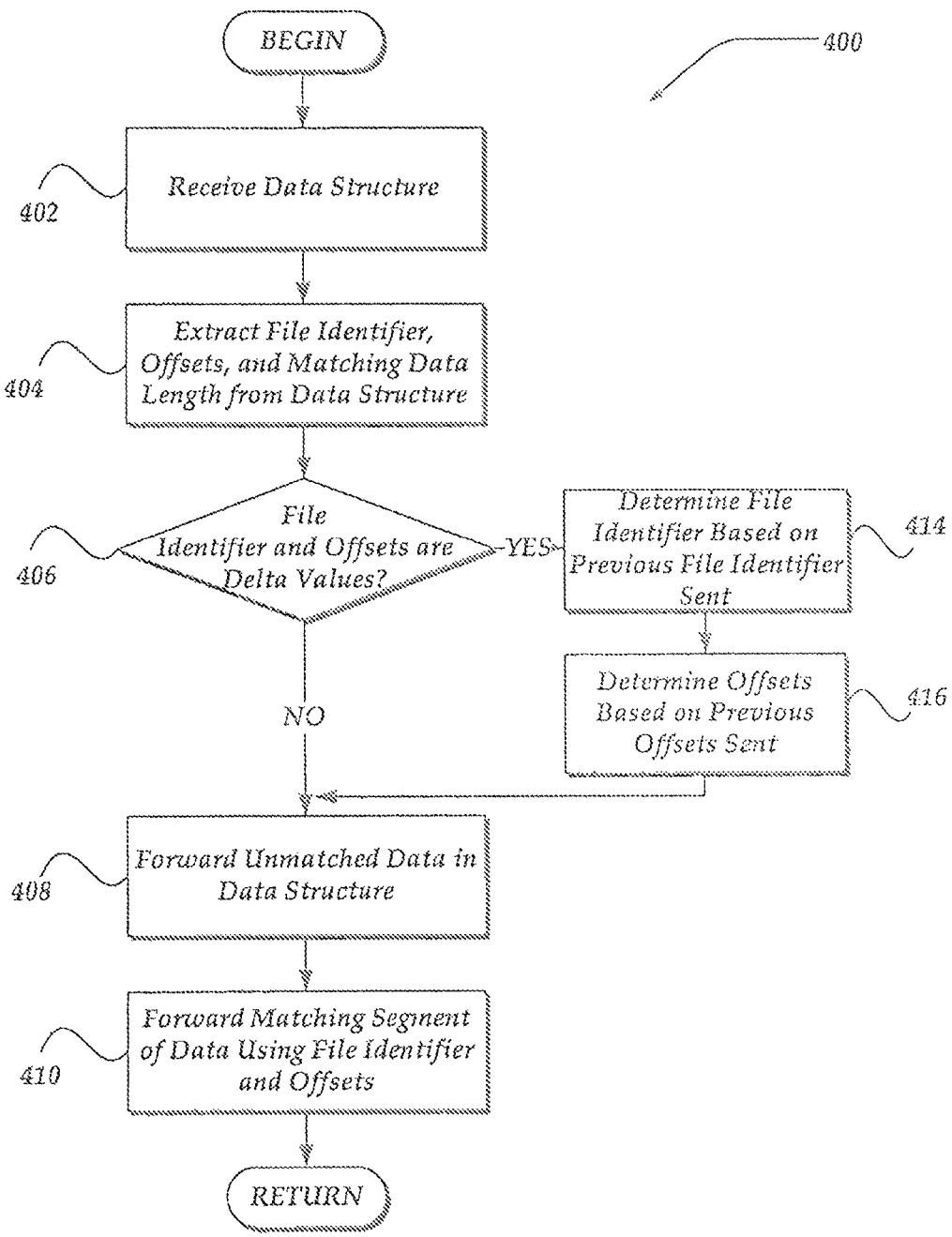
FIG. 4 illustrates a logical flow diagram generally showing one embodiment of a process for decoding a data structure based on an encoded representation of matching redundant data and unmatched data.

FIG. 4 illustrates a logical flow diagram generally showing one embodiment of a process for recreating the input data based on a received encoded representation of a matching segment, and unmatched data. In one embodiment, process 400 of FIG. 4 is implemented with TDR 106 of FIG. 1.

Process 400 begins, after a start block, at block 402 when the data structure described above in conjunction with FIG. 3 is received. Processing continues to block 404, where a file identifier, offset, network offset, and matching segment length are extracted from the data structure. In one embodiment, if the data structure is encrypted, it is decrypted prior to extraction.

Processing continues next to decision block 406, where a determination is made whether the extracted pointers and offsets are delta values. If it is determined that the pointers and offsets are delta values, processing flows to block 414; otherwise, processing continues to block 408.

At block 414, the file identifier is determined based on a file identifier from within a previously sent data structure. The delta value within the current encoded representation may be added to a previously received value to determine the current file identifier. Processing continues to block 416, where offsets, and lengths, may be determined by summing previously sent offset and length values with the corresponding offset and length delta values in the current encoded representation. Processing then continues to block 408.

At block 408, the unmatched data in the data structure is extracted. In one embodiment the unmatched data may be compressed within the data structure, in which instance, it may be uncompressed when it is extracted. The unmatched data is typically of a length identified by the network offset obtained at block 404. In one embodiment, it may be that no unmatched data exists within the data structure. If unmatched data is present in the data structure, however, the unmatched data may precede the matching data within the recreated input data. Thus, in one embodiment, the unmatched data may be forwarded to a receiving device. In another embodiment, a buffer may be employed to recreate the input data. In which instance, the unmatched data, if present, may be placed into the buffer before the matching data.

Processing continues next to block 410, where the matching segment is extracted from a synchronized store. The file identifier and offset obtained at block 404 (and/or 414 and 416), are used to provide an index into the synchronized store to start the extraction of matching data. Data is extracted from the synchronized store for the matching segment length. The extracted data may then be forwarded to the receiving device. If a buffer is employed, the matching segment may be placed within the buffer, and the recreated input data may be sent to the receiving device. Upon completion of block 410, the process may return to a calling process to perform other actions.

Figure 5:
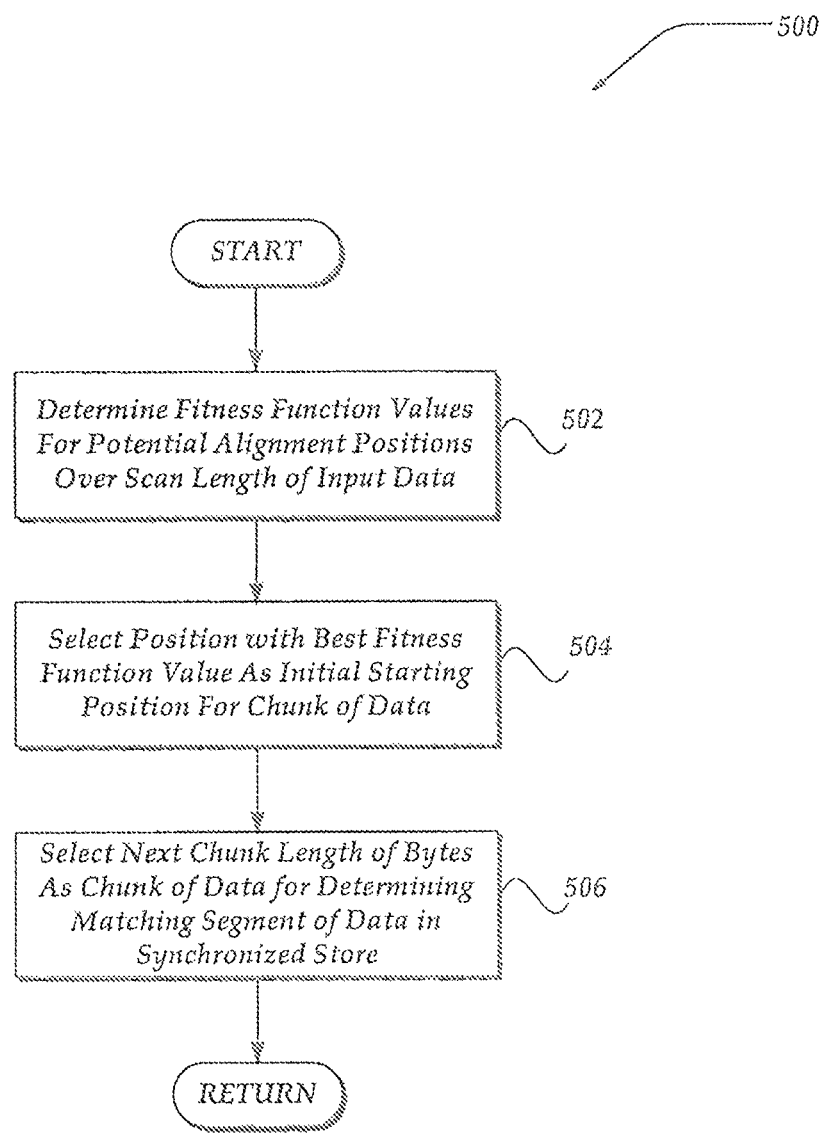
FIG. 5 illustrates a logical flow diagram generally showing one embodiment of a process for selecting a candidate chunk of data for use in identifying an initial starting position in a synchronized store.

FIG. 5 illustrates a logical flow diagram generally showing one embodiment of a process for selecting a candidate chunk of data for use in determining a starting position within a synchronized store for determining a matching segment. Process 500 of FIG. 5 may be called from block 304 of process 300 described above.

Process 500 may be illustrated using FIG. 8. FIG. 8 illustrates functional diagrams of one embodiment employing an input data buffer upon which a fitness function may be performed to select the starting position. Turning first, therefore, to FIG. 8, buffers 800A-800E are shown as sequences of a window 808. The buffer is configured to be a length (size) equal to a sum of a portion of the lengths of input data 804, scan length 802, and chunk 806. In one embodiment, the portion of input data 804 is about 128K bytes. However, the invention is not so limited, and virtually any input data length may be selected. Scan length 802 is selected as a value typically of length chunk 806 or less. In one embodiment, chunk 806 is a fixed length of about 64 to 128 bytes in size. Window 808 may be set to the same size as chunk 806. Window 808 is employed as a sliding window which is moved across the portion of input data 804 when determining a candidate starting position as described in process 500.

Thus, returning to FIG. 5, process 500 begins, at block 502, after at least a portion of the input data is copied into a buffer, such as buffer 800A described above. In one embodiment, scan length 802 and chunk 806 includes zeroed or nulled data.

At block 502, multiple fitness functions are determined by sliding window 808 over the buffer, as seen in buffers 808B-E. In one embodiment, window 808 may be slid one byte at a time. However, the invention is not so limited, and window 808 may also be moved based on multiples of bytes, or the like.

At each new position of window 808, another fitness function value is determined. In one embodiment, the fitness function value is determined by summing values of the data within window 808. However, the invention is not limited to summing of the data, and another fitness function may be employed, including but not limited to a hashing function, or the like. In any event, this process may continue until no further data within input data 804 is within window 808. Each movement of window 808 results in another fitness function for a given candidate starting position within input data 804.

The candidate starting positions may be identified as a position within input data 804 corresponding to a leftmost data item within window 808.

Processing next flows to block 504, where a candidate starting position is selected within the input data based on the best fitness function value. In one embodiment, the best fitness function value is determined based on the highest sum recorded for a given candidate starting position. Process 500 continues next to block 506, where a chunk of data is selected from the input data. In one embodiment, the chunk of data is selected starting at the candidate starting position, and including the chunk size of data from the input data from which the best fitness function is generated. Process 500 then returns to a calling process to perform other actions.

Figure 6:
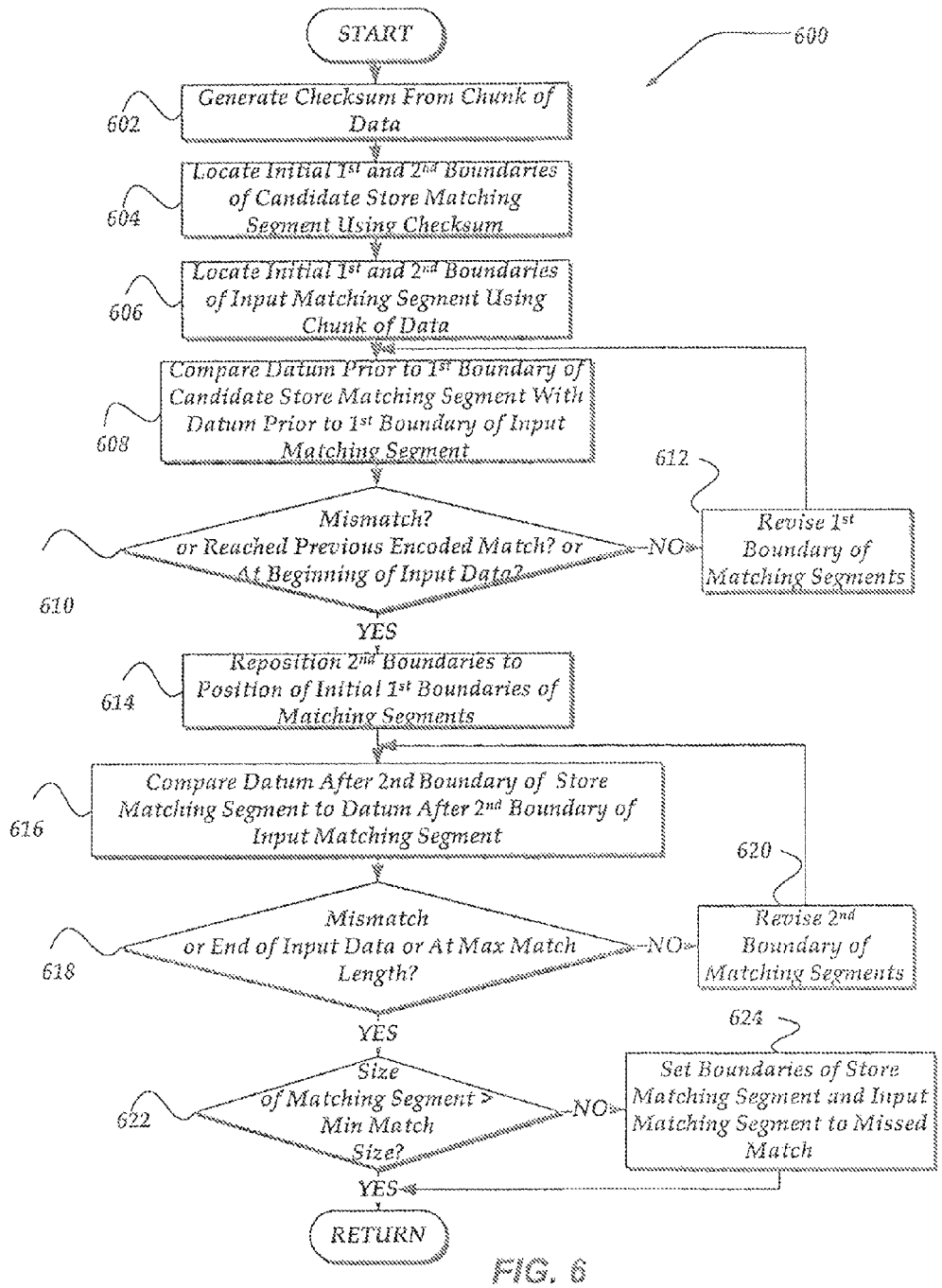
FIG. 6 illustrates a logical flow diagram generally showing one embodiment of a process for determining the selectively revised boundaries of a matching segment of data.

FIG. 6 illustrates a logical flow diagram generally showing one embodiment of a process for selectively revising at least one boundary of matching segments of data in a synchronized store and input data by using a selected chunk of data in the input data to locate an initial starting position in the synchronized store. In one embodiment, system 600 of FIG. 6 may be called from block 306 of FIG. 3.

Process 600 begins, after a start block, when a checksum is generated for the selected chunk of data identified within the input data. Although a checksum is employed, the invention is not constrained to checksums, and virtually any hash function may be employed, including, but not limited to Fletcher's checksum, Alder-32 checksum, CRC-32, MD-2, MD-4, MD-5, Snefru message digest function, or the like. In one embodiment, a modulo operation may be performed upon the generated checksum.

Processing then proceeds to block 604, where the resulting checksum may be used as an index into a dictionary to obtain a file identifier and offset. The file identifier and offset may then be used to locate an initial starting position within the synchronized store for performing the match comparisons. The initial starting position within the synchronized store provides an initial first boundary of the candidate store matching segment within the synchronized store. As used herein, the term "left boundary," as associated with the candidate store matching segment, refers to a separator that distinguishes data within the candidate store matching segment from data prior to the candidate store matching segment. Using the size of the chunk of data, the end, or initial second boundary of the candidate store matching segment is also determined. As used herein, the term "right boundary," as associated with the candidate store matching segment, refers to a separator that distinguishes data within the candidate store matching segment from data after the candidate store matching segment.

Similarly, a "left boundary," associated with an input matching segment, refers to a separator that distinguishes data within the input matching segment from data prior to the input matching segment, and a "right boundary," associated with an input matching segment, refers to a separator that distinguishes data within the input matching segment from data after the input matching segment.

Figure 9:
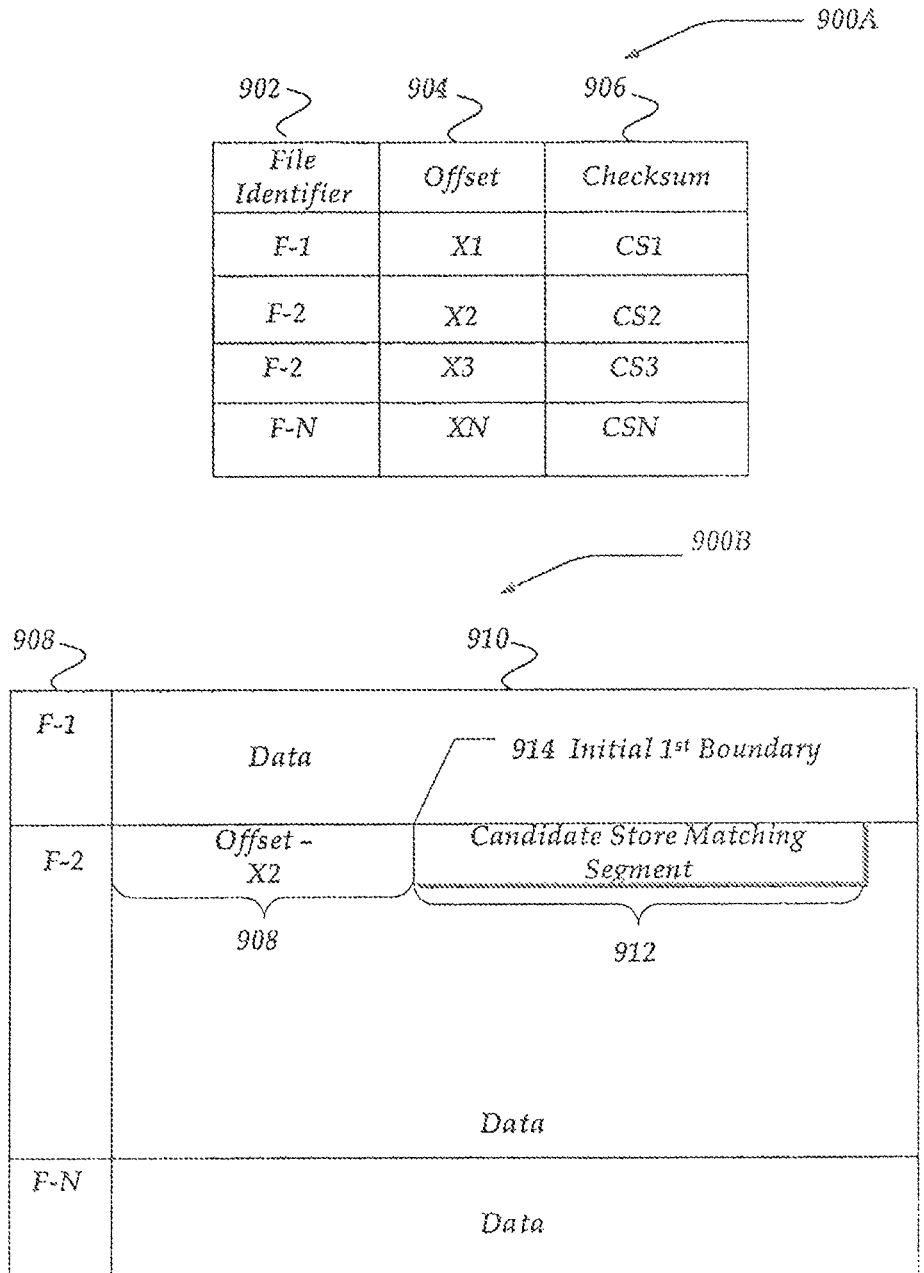
FIG. 9 illustrates functional diagrams for one embodiment of a dictionary and synchronized store for use in practicing the invention.
Figure 10:
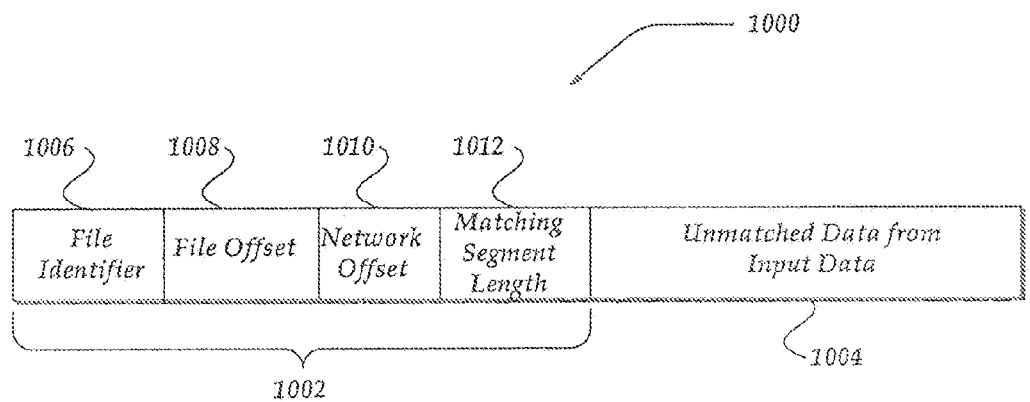
FIG. 10 illustrates embodiments of a data structure of an encoded representation of a matching segment of data and unmatched data.

Shown in FIG. 9 is one embodiment of a dictionary (900A) and synchronized store 900B to illustrate actions of block 604. Dictionary 900A includes file identifiers 902, offsets 904, and checksums 906. Synchronized store 900B includes file identifiers 908 and data 910.

Data 910 may include virtually any data that has been previously sent over the network to another device. Although the invention refers to data 910 as organized by file identifiers 908, data 910 need not represent a file per se. Rather, data 910 may include any portion of data previous sent over the network, including portions of a file, document, spreadsheet, movie, graphic, audio file, or the like.

File identifiers 902 may be ordered such that the checksum determined at block 602 may be used as an index into dictionary 900A. Offsets 904 include offsets into a given file, or other data structure, from which a match comparison may be started. Checksums 906 are optionally included as a cross-check to increase the likelihood that the checksum computed at block 602 will find a portion of data within synchronized store 900B that matches the chunk of data from the input data. However, the invention does not require that the matches be identical.

Using FIG. 9 to illustrate, the checksum determined at block 602 is used to locate within dictionary 900A a file identifier and offset. For example, assume that F-2 is the file identifier and X2 is the located offset. The located file identifier is then used to locate the associated file, F-2, within synchronized store 900B. The offset, X2, is used to identify a starting position (initial first boundary) within the portion of data 910 associated with file F-2. Thus, in our example, initial first boundary 914 within synchronized store 900B is the identified position before which the match comparisons may begin. Candidate store matching segment 912 is also illustrated.

Continuing with process 600 of FIG. 6, at block 606 a corresponding initial first and second boundaries are located for the input matching segment within the input data. The first boundary may be determined based on the initial starting position of the selected chunk of data. The second boundary is determined based on the ending position of the selected chunk of data within the input data.

Processing then proceeds to block 608, where a comparison is performed between datum prior to the first boundary of the candidate store matching segment and datum prior to the first boundary of the input matching segment. Processing flows next to decision block 610, where a determination is made whether the comparison results in a mismatch, whether a previously encoded matching segment has been reached, or whether the comparison has reached the beginning of the input data. Monitoring for the previously encoded matching segment enables the invention to include potentially all of the unmatched data in a previous action. In any event, if any one or more of these conditions are satisfied, processing flows to block 614; otherwise, a match is determined to exist between data in the input data and the synchronized store, and processing flows to block 612.

At block 612, the first boundary of the input matching segment and the first boundary of the store matching segment are revised to include the matched data within the respective matching segments. Processing then loops back to block 608, to continue the comparisons and selectively revising the first boundary of the matching segments to include additional data prior to the first boundary.

At block 614, the positions of the initial second boundaries for the store matching segment and the input matching segment are relocated to where the initial first boundaries were identified in blocks 604 and 606. By repositioning the second boundaries, comparisons may be performed between data within the chunk of data of the input data and within the initial candidate store matching segment. Process then continues to block 616.

At block 616, a comparison is performed between datum after the second boundary of the store matching segment and datum after the second boundary of the input matching segment.

Processing continues next to decision block 618, where a determination is made whether a mismatch is found, whether the end of the input data is reached, or whether a maximum match length has been reached. The maximum match length may be employed to reduce encoding latencies that may arise where a large matching data segment is encountered. In one embodiment, the maximum match length may range from between about 250K bytes to about 500K bytes of matching data. However, the invention is not constrained to these values, and the maximum match length may be set to another value based on a computing capability, engineering judgment, or the like. In any event, if one or more of these conditions are satisfied, processing flows to decision block 622. Otherwise, a match is determined to exist between datum in the input data and the synchronized store, and processing flows to block 620.

At block 620, the second boundaries for the input matching segment and the store matching segment are revised to include the matched datum within the respective matching segments. Processing then loops back to block 616, to continue the comparisons and selectively revising the boundaries of the matching segments.

At decision block 622, a determination is made whether the size of the matching segment is greater than a minimum match size. It is noted that at this block, the size of the input matching segment and the store matching segment are substantially the same. Thus, the determination may be based on either the input or the store matching segment.

Moreover, this determination is directed towards preventing the encoding of too small of matching data segments, as small matching data segments may also impact performance. Although the minimum match size may be set to a variety of values, in one embodiment, it may be set to between about 100 bytes to about 500 bytes. Thus, if the size of the matching segment is less than the minimum match size processing branches to block 624; otherwise, processing returns to a calling process to perform other actions.

At block 624, the boundaries of the matching segments are set for missed matches. In one embodiment, setting the boundaries for missed matches results in a zero size, or null length matching segment. That is, the matching segments' boundaries are set to exclude all data—the null set. Processing then returns to the calling process to perform other actions.

Figure 11:
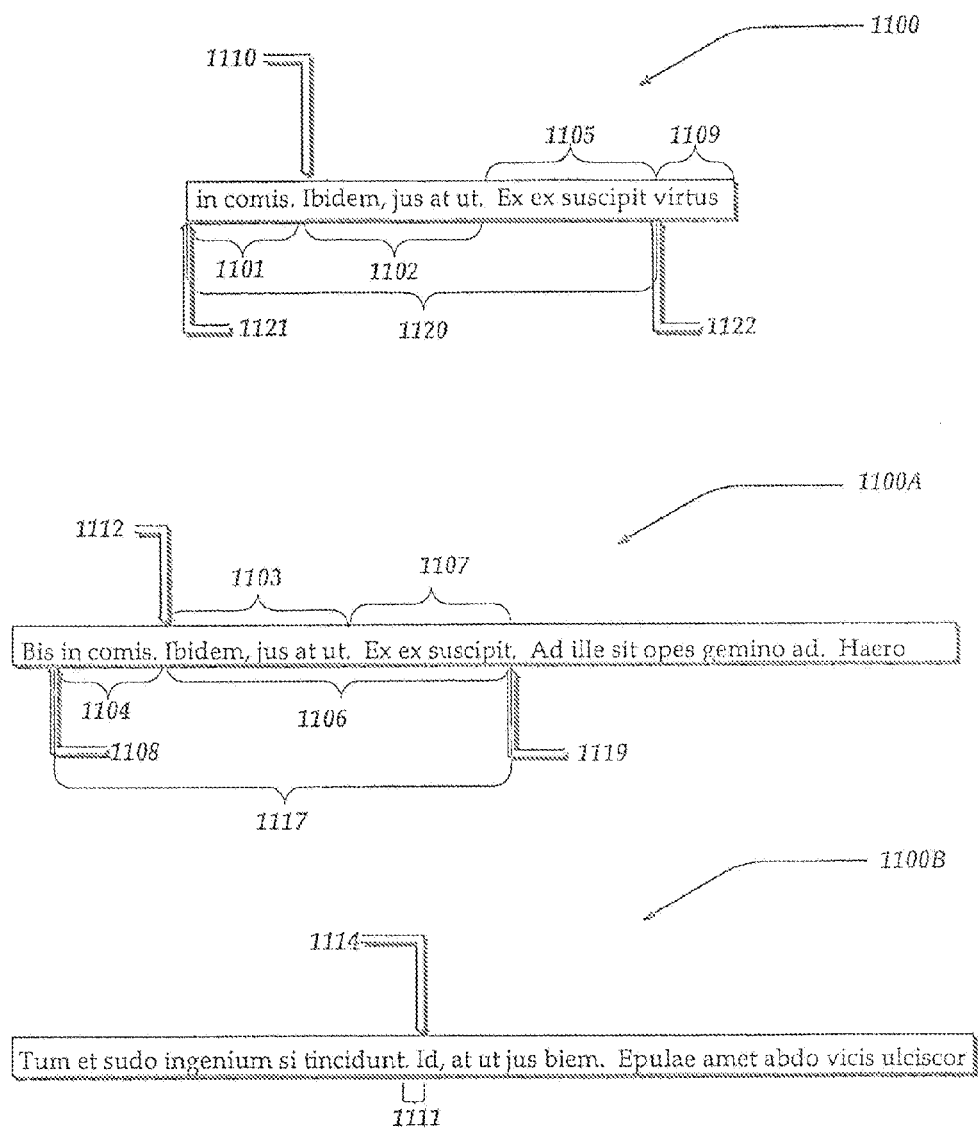
FIG. 11 illustrates functional block diagrams of example input data and synchronized stores usable to further describe the invention, in accordance with the invention.

Several aspects of process 600 may be illustrated using examples shown in FIG. 11. Shown in FIG. 11 is example input data 1100, and example synchronized stores 1100A and 1100B. Further, input data 1100 includes initial input matching segment 1102 that may be selected based on a best fitness function. Initial input matching segment 1102 may be determined based on a best fitness function and selected chunk of data. Thus, initial input matching segment 1102 is the same position and size and the selected chunk of data, although the invention is not so constrained. An initial first boundary 1110 within input data 1100 is also illustrated based on input matching segment 1102.

As shown in example synchronized store 1100A, candidate store matching segment 1103 is illustrated with initial first boundary 1112. Using synchronized store 1100A, data prior to initial first boundary 1112 is where comparisons with input data 1100 may begin. As described above, as data prior to the first boundaries are found to match, the first boundaries are selectively revised to include the matched data within corresponding resulting input matching segment and store matching segment. Revisions to the first boundaries selectively continue as matching data is identified.

As shown, data 1104 in synchronized store 1100A matches data 1101 in input data 1100. Process 600 would identify a match data "in comis." and result in revising the first boundary of store matching segment to resulting first boundary 1108. Similarly, the resulting first boundary of input matching segment would be revised to resulting first boundary 1121.

Process 600 then proceeds to locate the second boundaries of the input matching segment and store matching segment at the initial first boundaries 1110 and 1112, respectively. Comparisons of data after the second boundaries are then performed as described above. The resulting positions of the second boundaries are illustrated as resulting second boundary 1122 and 1119 for input matching segment and store matching segment, respectively.

Thus, in this example, the matches continued to include not only initial input matching segment 1102 (which matches data 1103 in synchronized store 1100A), but to further include data 1105 (which matches data 1107 in synchronized store 1100A). Completion of process 600, using this example, has selectively revised the first and second boundaries of the matching segments, to generate resulting input matching segment 1120 and resulting store matching segment 1117.

In another example, however, this might not always be the case. As shown in synchronized store 1100B, only data 1111 is found to match data within input data 1100. In this situation, the size of data 1111 may be determined to be less than the minimum match size, in which case, the matching segments may be set to zero in size, to indicate a missed match.

Thus, as illustrated above, contiguous data within the input data may included with the matching data, although it was not initially included in the chunk of data. It is also possible that a subset of the initial chunk of data is excluded from the resulting matching data segment. Moreover, it is further possible that none of the initial chunk of data is found to match data within the synchronized store; yet, data to prior to the initial starting positions may still be included in the resulting matching data segment. Therefore, using process 600, the resulting matching data segments may include more or less than the initial chunk of data. It might even not include any of the initial chunk of data from the input data.

Managing of the synchronized store may include updates based on any unmatched data within a data structure generated in process 300 of FIG. 3. One embodiment of a logical flow diagram generally showing one process for updating a synchronized store with unmatched data is illustrated in FIG. 7. Process 700 of FIG. 7 may be implemented, for example, within TDRs 106-107 of FIG. 1.

As shown, process 700 begins, after a start block, at block 702 when unmatched data is received. In one embodiment, the unmatched data may be provided to process 700 as an output of process 300 of FIG. 3. Processing then flows to decision block 704 to determine whether the received unmatched data is of a length that is less than a predetermined minimum length. In one embodiment, the minimum length is predetermined based on a variety of criteria, including a computer processing speed, engineering judgment, or the like. For example, in one embodiment, the predetermined minimum length may be set to about the same value as the minimum match length employed in process 600 of FIG. 6. In any event, if it is determined that the unmatched data length is less than the predetermined minimum length, process 700 returns to a calling process, and no update is performed to the synchronized store.

Alternatively, if, at decision block 704, it is determined that the unmatched data exceeds the predetermined minimum length, processing continues to block 706 where a fitness function may be employed to select a chunk of data within the unmatched data. In one embodiment, the selection of the chunk of data is substantially similar to process 500 described above in conjunction with FIG. 5. However, the selection is within the unmatched data portion. Moreover, in one embodiment, the size of the chunk of data is the same as used to determine the matching segment of data. Processing then flows to block 708, where a checksum is generated for the selected chunk of data. Generating of the checksum is substantially similar to block 602 described above in conjunction with FIG. 6.

Processing next continues to block 710, where the dictionary is searched to for a matching checksum. Processing flows to decision block 712, where a determination is made whether a matching checksum is located within the dictionary. Typically, a matching checksum is not expected to be found; otherwise, the unmatched data portion would have been located within the synchronized store and included within the matching data for the input data. Thus, if no match is found, processing continues to block 716. However, when a matching checksum is found, then processing proceeds to block 714, where a collision resolution is performed. Any of a variety of collision resolution mechanisms may be employed, including, but not limited to hash chaining, probing, or the like, that determines another position within the dictionary to locate references to the unmatched data. Once a new position within the dictionary is located, processing flows to block 716.

At block 716, the unmatched data is entered into the synchronized store with a file identifier and offset. In one embodiment, the file identifier may be a file identifier associated with the input data, and the offset, may be an offset into the input data. However, the invention is not so limited, and other file identifiers and offsets may be employed.

Processing then continues to block 718, where the dictionary is updated by inserting the generated checksum, file identifier, and offset at a position based on the checksum. Process 700 then returns to a calling process to perform other actions.

It will be understood that each block of the flowchart illustration, and combinations of blocks in the flowchart illustration, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor to provide steps for implementing the actions specified in the flowchart block or blocks.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

The above specification, examples, and data provide a complete description of the manufacture and use of the composition of the invention. Since many embodiments of the invention can be made without departing from the spirit and scope of the invention, the invention resides in the claims hereinafter appended.

What is claimed as new and desired to be protected by Letters Patent of the United States is:

1. A method operating on one or more network devices, comprising:
   receiving input data;
   selecting a candidate input matching data segment from within the input data by sliding a window over the input data and for each of a plurality of different locations of the sliding window determining a fitness function from a portion of the input data within the sliding window and further selecting a portion of the input data having a determined best fitness function value by performing a comparison between each of the determined fitness functions;
   determining a corresponding candidate store matching segment of data in a synchronized store based on an index determined from the selected candidate input matching data segment, the index being used to obtain a file identifier and offset that is then used to locate within the synchronized store the candidate store matching segment;
   selectively revising at least one boundary of the candidate input matching data segment by comparing data contiguous with the candidate store matching segment with data contiguous with the candidate input matching data segment to generate an input matching data segment of the input data;
   determining an encoded representation of the input matching data segment at least partly based on the synchronized store; and
   transmitting over a network a data structure that includes at least a portion of an unmatched portion of the data within the input data and the encoded representation.

2. The method of claim 1, further comprising:
   receiving the transmitted data structure;
   extracting from the data structure, an other file identifier, an other offset, a matching segment length;
   employing the other file identifier, other offset, and matching segment length to extract data from a second synchronized store that matches the input matching data segment; and
   combining the unmatched portion of the data with the extracted data.

3. The method of claim 1, wherein selectively revising at least one boundary further comprises selectively revising a corresponding boundary of the candidate store matching segment based on the boundaries of the input matching data segment.

4. The method of claim 1, wherein the input matching data segment includes data prior to the candidate input matching data segment and excludes the candidate input matching data segment.

5. The method of claim 1, wherein the determined input matching data segment includes a first portion of the selected candidate input matching data segment and excludes a second portion of the selected candidate input matching data segment.

6. The method of claim 1, wherein the input matching data segment includes the candidate input matching data segment and data prior to the candidate input matching data segment.

7. The method of claim 1, further comprising:
   if the candidate store matching segment is less than a minimum match size, setting the candidate store matching segment to a null length data segment.

8. The method of claim 1, wherein determining the input matching data segment further comprises:
   determining a portion of the candidate input matching data segment to include in the input matching data segment based on a comparison of at least a portion of the candidate input matching data segment with the candidate store matching data segment.

9. A network device for use in managing a data transfer over a network, comprising:
- a transceiver to send and receive the data over the network; and
- a computer processor executing a data reduction component that performs actions, including:
  - receiving input data;
  - selecting a candidate input matching data segment from within the input data based on using a sliding window over the input data to select a portion of the input data corresponding to a best fitness function value, wherein each fitness function value is computed from a portion of the input data within the sliding window and the best fitness function value is determined by performing a comparison between each of the plurality of computed fitness function values;
  - determining a corresponding candidate store matching segment of data in a synchronized store based on an index determined from the selected candidate input matching data segment, the index being used to obtain a file identifier and offset into the synchronized store;
  - selectively revising at least one boundary of the candidate input matching data segment by comparing data contiguous with the candidate store matching segment with data contiguous with the candidate input matching data segment to generate an input matching data segment of the input data;
  - determining an encoded representation of the input matching data segment at least partly based on the synchronized store; and
  - transmitting over the network a data structure that includes at least a portion of an unmatched portion of the data within the input data and the encoded representation.

10. The network device of claim 9, wherein selectively revising at least one boundary further comprises comparing data that is contiguous with and after a left boundary of the candidate store matching segment with data that is contiguous with and after a left boundary of the input matching segment.

11. The network device of claim 9, wherein selectively revising at least one boundary further comprises comparing data that is contiguous with and after a right boundary of the candidate store matching segment with data that is contiguous with and after a right boundary of the input matching segment.

12. The network device of claim 9, wherein determining the corresponding store matching data segment further comprises revising boundaries of the candidate store matching data segment based on the corresponding boundaries of the input matching data segment.

13. The network device of claim 9, wherein selecting the candidate input matching data segment from input data further comprises:
- selecting a portion from the plurality of portions of the input data based on the best fitness function value, the selected portion indicating an initial left boundary of the candidate input matching data segment.

14. The network device of claim 9, wherein the unmatched portion of input data is a null length data segment.

15. The network device of claim 9, wherein the synchronized store is updated to include the unmatched portion of data.

16. A system of managing a data transfer over a network, comprising:
- a first network device that is configured to perform actions comprising:
  - receiving input data;
  - selecting a candidate input matching data segment from within the input data based on using a sliding window over the input data to select a portion of the input data corresponding to a best fitness function value, wherein each fitness function value is computed from a portion of the input data within the sliding window and the best fitness function value is determined by performing a comparison between each of the plurality of computed fitness function values;
  - determining a corresponding candidate store matching segment of data in a synchronized store based on an index determined from the selected candidate input matching data segment, the index being used to obtain a file identifier and offset that is then used to locate within the synchronized store the candidate store matching segment;
  - selectively revising at least one boundary of the candidate input matching data segment by comparing data contiguous with the candidate store matching segment with data contiguous with the candidate input matching data segment to generate an input matching data segment of the input data;
  - determining an encoded representation of the input matching data segment at least partly based on the synchronized store; and
  - transmitting over the network a data structure that includes at least a portion of an unmatched portion of the data within the input data and the encoded representation; and
- a second network device that is configured to perform actions comprising:
  - receiving the transmitted data structure;
  - employing the encoded representation in the data structure to extract, from a second synchronized store, data that matches the input matching data segment; and
  - combining the unmatched portion of the data with the extracted data.

17. The system of claim 16, wherein determining the corresponding store matching data segment further comprises revising boundaries of the candidate store matching data segment based on the corresponding boundaries of the input matching data segment.

18. The system of claim 16, wherein selecting the candidate input matching data segment from input data further comprises:
- selecting a portion from the plurality of portions of the input data based on a best fitness function value, the selected portion indicating an initial left boundary of the candidate input matching data segment.

19. The system of claim 16, wherein the unmatched portion of input data is a null length data segment.

20. The system of claim 16, wherein the synchronized store is updated to include the unmatched portion of data.

* * * * *